United States Patent
Schubert et al.

(10) Patent No.: US 12,340,973 B2
(45) Date of Patent: Jun. 24, 2025

(54) PARTICLE BEAM SYSTEM INCLUDING A MULTI-BEAM DEFLECTION DEVICE AND A BEAM STOP, METHOD FOR OPERATING THE PARTICLE BEAM SYSTEM AND ASSOCIATED COMPUTER PROGRAM PRODUCT

(71) Applicant: Carl Zeiss MultiSEM GmbH, Oberkochen (DE)

(72) Inventors: Stefan Schubert, Oberkochen (DE); Dieter Schumacher, Gerstetten (DE); Erik Essers, Aalen (DE); Ingo Mueller, Aalen (DE); Arne Thoma, Heidenheim (DE); Joerg Jacobi, Heidenheim (DE); Wilhelm Bolsinger, Oberkochen (DE); Dirk Zeidler, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 488 days.

(21) Appl. No.: 17/663,323

(22) Filed: May 13, 2022

(65) Prior Publication Data
US 2022/0277927 A1     Sep. 1, 2022

Related U.S. Application Data

(63) Continuation of application No. PCT/EP2020/025535, filed on Nov. 24, 2020.

(30) Foreign Application Priority Data

Nov. 27, 2019    (DE) .......................... 102019008249.4

(51) Int. Cl.
     *H01J 37/28*     (2006.01)
     *H01J 37/04*     (2006.01)
     (Continued)

(52) U.S. Cl.
CPC ............ *H01J 37/28* (2013.01); *H01J 37/045* (2013.01); *H01J 37/1474* (2013.01);
(Continued)

(58) Field of Classification Search
CPC ...... H01J 37/28; H01J 37/045; H01J 37/1474; H01J 37/244; H01J 37/3177; H01J 2237/0435
(Continued)

(56) References Cited

U.S. PATENT DOCUMENTS

| | | |
|---|---|---|
| 4,130,761 A | 12/1978 | Matsuda |
| 4,153,843 A | 5/1979 | Pease |

(Continued)

FOREIGN PATENT DOCUMENTS

| | | |
|---|---|---|
| DE | 102013014976 A1 | 3/2015 |
| DE | 102013016113 A1 | 3/2015 |

(Continued)

OTHER PUBLICATIONS

Japanese Office Action, with translation thereof, for corresponding JP Appl No. 2022-531032, dated Dec. 5, 2023.
(Continued)

*Primary Examiner* — Michael Maskell
(74) *Attorney, Agent, or Firm* — Fish & Richardson P.C.

(57) ABSTRACT

A particle beam system, such as a multi-beam particle microscope, includes a multi-beam deflection device and a beam stop. The multi-beam deflection device is arranged in the particle-optical beam path downstream of the multi-beam generator and upstream of the beam switch of the particle beam system. The multi-beam deflection device serves collectively blanks a multiplicity of charged individual particle beams. These impinge on a beam stop, which is arranged in the particle-optical beam path level with a site at which a particle beam diameter is reduced or is at a
(Continued)

minimum. By way of example, such sites are the cross-over plane of the individual particle beams or an intermediate image plane. Associated methods for operating the particle beam system and associated computer program products are disclosed.

20 Claims, 8 Drawing Sheets

(51) Int. Cl.
  *H01J 37/147* (2006.01)
  *H01J 37/244* (2006.01)
  *H01J 37/317* (2006.01)
(52) U.S. Cl.
  CPC ........ *H01J 37/244* (2013.01); *H01J 37/3177* (2013.01); *H01J 2237/0435* (2013.01)
(58) Field of Classification Search
  USPC ...... 250/396 R, 492.1–492.3, 306, 307, 310, 250/311
  See application file for complete search history.

(56) References Cited

U.S. PATENT DOCUMENTS

| | | |
|---|---|---|
| 4,200,794 A | 4/1980 | Newberry |
| 4,338,548 A | 7/1982 | Bono |
| 4,742,234 A | 5/1988 | Feldman |
| 5,215,623 A | 6/1993 | Takahashi |
| 5,864,142 A | 1/1999 | Muraki |
| 5,892,224 A | 4/1999 | Nakasuji |
| 5,905,267 A | 5/1999 | Muraki |
| 5,981,954 A | 11/1999 | Muraki |
| 6,107,636 A | 8/2000 | Muraki |
| 6,124,599 A | 9/2000 | Muraki |
| 6,137,113 A | 10/2000 | Muraki |
| 6,323,499 B1 | 11/2001 | Muraki |
| 6,333,508 B1 | 12/2001 | Katsap |
| 6,617,595 B1 | 9/2003 | Okunuki |
| 6,633,366 B2 | 10/2003 | De Jager |
| 6,696,371 B2 | 2/2004 | Butschke |
| 6,787,780 B2 | 9/2004 | Hamaguchi |
| 6,804,288 B2 | 10/2004 | Haraguchi |
| 6,818,911 B2 | 11/2004 | Tamamori |
| 6,835,508 B2 | 12/2004 | Butschke |
| 6,872,950 B2 | 3/2005 | Shimada |
| 6,903,345 B2 | 6/2005 | Ono |
| 6,903,353 B2 | 6/2005 | Muraki |
| 6,917,045 B2 | 7/2005 | Hashimoto |
| 6,919,574 B2 | 7/2005 | Hashimoto |
| 6,943,349 B2 | 9/2005 | Adamec |
| 6,953,938 B2 | 10/2005 | Iwasaki |
| 6,992,290 B2 | 1/2006 | Watanabe |
| 7,005,658 B2 | 2/2006 | Muraki |
| 7,015,467 B2 | 3/2006 | Maldonado |
| 7,060,984 B2 | 6/2006 | Nagae |
| 7,084,411 B2 | 8/2006 | Lammer-Pachlinger |
| 7,091,504 B2 | 8/2006 | Wieland |
| 7,109,494 B2 | 9/2006 | Ono |
| 7,126,141 B2 | 10/2006 | Ono |
| 7,129,502 B2 | 10/2006 | Kruit |
| 7,244,949 B2 | 7/2007 | Knippelmeyer |
| 7,285,779 B2 | 10/2007 | Litman |
| 7,375,326 B2 | 5/2008 | Sender |
| 7,420,164 B2 | 9/2008 | Nakasuji |
| 7,468,507 B2 | 12/2008 | Rogers |
| 7,504,622 B2 | 3/2009 | Elyasaf |
| 7,535,001 B2 | 5/2009 | Sender |
| 7,601,972 B2 | 10/2009 | Nakasuji |
| 7,619,203 B2 | 11/2009 | Elyasaf |
| 7,696,497 B2 | 4/2010 | Rogers |
| 8,035,082 B2 | 10/2011 | Yamazaki |
| 8,134,135 B2 | 3/2012 | Kruit |
| 8,350,214 B2 | 1/2013 | Otaki |
| 8,362,425 B2 | 1/2013 | Han |
| 8,384,051 B2 | 2/2013 | Ozawa |
| 8,598,525 B2 | 12/2013 | Zeidler |
| 8,618,496 B2 | 12/2013 | Wieland |
| 8,704,192 B2 | 4/2014 | Sano |
| 8,748,842 B2 | 6/2014 | Ohashi |
| 8,759,796 B2 | 6/2014 | Biberger |
| 8,779,399 B2 | 7/2014 | Yamanaka |
| 8,829,465 B2 | 9/2014 | Tsunoda |
| 8,963,099 B2 | 2/2015 | Yamada |
| 9,153,413 B2 | 10/2015 | Almogy |
| 9,263,233 B2 | 2/2016 | Zeidler |
| 9,336,981 B2 | 5/2016 | Knippelmeyer |
| 9,336,982 B2 | 5/2016 | Zeidler |
| 9,349,571 B2 | 5/2016 | Kemen |
| 9,368,314 B2 | 6/2016 | Nakasuji |
| 9,530,613 B2 | 12/2016 | Rogers |
| 9,536,702 B2 | 1/2017 | Lang |
| 9,607,805 B2 | 3/2017 | Liu |
| 9,653,254 B2 | 5/2017 | Zeidler |
| 9,702,983 B2 | 7/2017 | Eder |
| 9,922,799 B2 | 3/2018 | Li |
| 9,991,089 B2 | 6/2018 | Mueller |
| 10,062,541 B2 | 8/2018 | Ren |
| 10,141,160 B2 | 11/2018 | Ren |
| 10,354,831 B2 | 7/2019 | Kemen |
| 10,388,487 B2 | 8/2019 | Zeidler |
| 10,483,080 B1* | 11/2019 | Cook .................. H01J 37/147 |
| 10,535,494 B2 | 1/2020 | Zeidler |
| 10,541,112 B2 | 1/2020 | Schubert |
| 10,586,677 B1 | 3/2020 | Okada |
| 10,600,613 B2 | 3/2020 | Zeidler |
| 10,622,184 B2 | 4/2020 | Knippelmeyer |
| 10,643,820 B2 | 5/2020 | Ren |
| 10,741,355 B1 | 8/2020 | Zeidler |
| 10,811,215 B2 | 10/2020 | Zeidler |
| 10,854,423 B2 | 12/2020 | Sarov |
| 10,879,031 B2 | 12/2020 | Ren |
| 10,896,800 B2 | 1/2021 | Riedesel |
| 2004/0183013 A1 | 9/2004 | Nakasuji et al. |
| 2009/0014649 A1 | 1/2009 | Nakasuji |
| 2009/0261251 A1 | 10/2009 | Hayakawa et al. |
| 2010/0117001 A1 | 5/2010 | Looije |
| 2010/0244790 A1 | 9/2010 | La Rosa |
| 2012/0126138 A1 | 5/2012 | Ozawa |
| 2014/0197325 A1 | 7/2014 | Kato |
| 2016/0211114 A1 | 7/2016 | Iwata |
| 2016/0240344 A1* | 8/2016 | Kemen ............... H01J 37/3177 |
| 2017/0133198 A1 | 5/2017 | Kruit |
| 2018/0151327 A1 | 5/2018 | Budach |
| 2019/0051487 A1 | 2/2019 | Ogasawara et al. |
| 2019/0333732 A1 | 10/2019 | Ren |
| 2020/0211810 A1 | 7/2020 | Zeidler |
| 2020/0243300 A1 | 7/2020 | Zeidler |
| 2020/0373116 A1 | 11/2020 | Zeidler |
| 2021/0005423 A1 | 1/2021 | Zeidler |
| 2021/0035773 A1 | 2/2021 | Zeidler |

FOREIGN PATENT DOCUMENTS

| | | |
|---|---|---|
| GB | 2519511 A | 4/2015 |
| GB | 2521819 A | 7/2015 |
| JP | 59184524 A | 10/1984 |
| JP | 60042825 A | 3/1985 |
| JP | 60105229 A | 6/1985 |
| JP | 61263217 A | 11/1986 |
| JP | 63-205039 A | 8/1988 |
| JP | 2000-285842 A | 10/2000 |
| JP | 2009-507352 A | 2/2009 |
| JP | 2009-277648 A | 11/2009 |
| JP | 2011-138649 A | 7/2011 |
| JP | 2013-254673 A | 12/2013 |
| JP | 2014229481 A | 12/2014 |
| JP | 2019-036403 A | 3/2019 |
| TW | I488211 B | 6/2015 |
| TW | 201921103 A | 6/2019 |
| WO | WO 02/49065 A1 | 6/2002 |
| WO | WO2005024881 A2 | 3/2005 |

(56) References Cited

FOREIGN PATENT DOCUMENTS

| WO | WO2007028595 A2 | 3/2007 |
|----|-----------------|--------|
| WO | WO2007028596 A1 | 3/2007 |
| WO | WO2007060017 A2 | 5/2007 |
| WO | WO2011124352 A1 | 10/2011 |
| WO | WO2013032949 A1 | 3/2013 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

International Search Report and Written Opinion for corresponding Appl No. PCT/EP2020/025535, mailed Apr. 12, 2021.
Japanese Office Action, with translation thereof, for corresponding JP Appl No. 2022-531032, dated Apr. 25, 2023.

\* cited by examiner

PARTICLE BEAM SYSTEM INCLUDING A MULTI-BEAM DEFLECTION DEVICE AND A BEAM STOP, METHOD FOR OPERATING THE PARTICLE BEAM SYSTEM AND ASSOCIATED COMPUTER PROGRAM PRODUCT

CROSS-REFERENCE TO RELATED APPLICATIONS

The present application is a continuation of, and claims benefit under 35 USC 120 to, international application PCT/EP2020/025535, filed Nov. 24, 2020, which claims benefit under 35 USC 119 of German Application No. 10 2019 008 249.4, filed Nov. 27, 2019. The entire disclosure of these applications are incorporated by reference herein.

FIELD

The disclosure relates to particle beam systems which operate with a multiplicity of particle beams.

BACKGROUND

Just like single-beam particle microscopes, multi-beam particle microscopes can be used to analyse objects on a microscopic scale. Images of an object that represent a surface of the object, for example, can be recorded using these particle microscopes. In this way, for example the structure of the surface can be analysed. While in a single-beam particle microscope a single particle beam of charged particles, such as, for example, electrons, positrons, muons or ions, is used to analyse the object, in a multi-beam particle microscope, a plurality of particle beams are used for this purpose. The plurality of the particle beams, also referred to as a bundle, are directed onto the surface of the object at the same time, as a result of which a significantly larger area of the surface of the object can be sampled and analysed as compared with a single-beam particle microscope within the same period of time.

WO 2005/024881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed onto a multi-aperture plate having a multiplicity of openings. One portion of the electrons of the electron beam strikes the multi-aperture plate and is absorbed there, and another portion of the beam passes through the openings in the multi-aperture plate, such that an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, such that the electron beams are focused in a plane situated at a distance from the multi-aperture plate. The plane in which the foci of the electron beams are formed is imaged by a downstream optical unit onto the surface of the object to be examined, such that the individual electron beams strike the object in a focused manner as primary beams. There they generate interaction products, such as backscattered electrons or secondary electrons, emanating from the object, which are shaped to form secondary beams and are directed onto a detector by a further optical unit. There each of the secondary beams strikes a separate detector element such that the electron intensities detected by the detector element provide information relating to the object at the site at which the corresponding primary beam strikes the object. The bundle of primary beams is scanned systematically over the surface of the object in order to generate an electron micrograph of the object in the manner that is customary for scanning electron microscopes.

In the multiple particle beam system described, a high resolution is, in general, highly relevant for satisfactory and successful use in practice. The resolution of particle beam systems is typically restricted by the scanning grid of individual pixels or dwell times per pixel on the sample and by the particle beam diameter. Generally, to observe a specified scanning grid or specified dwell times per pixel on the sample as exactly as possible, a precise control of the scanning particle beams is desirable and it may be desirable to briefly interrupt the incidence of the particle beams on the sample in a targeted fashion, for example in the case of a line jump in the scanning procedure or in the case of a displacement of the sample stage for the purposes of scanning a different sample region.

In general, the use of deflection devices in combination with a beam stop is known for such an interruption of particle beams (so-called "blanking") or for an interruption of the incidence of particle beams on an object. By way of example, corresponding arrangements for single-beam particle microscopes emerge from U.S. Pat. No. 8,759,796 B2 and US 2018/0151327 A1. The particle beam is deflected by electrically charged deflection plates and simple stops are used as beam stops. Since the beam diameter of a single particle beam is small in comparison with the beam tube diameter of a single-beam particle microscope, the stops can, in general, be positioned as desired within the particle-optical unit.

This design freedom generally does not exist in this way in multiple particle beam systems for reasons of space since the beam array has a relatively large diameter in comparison with the beam tube in the case of multiple beam particle systems. Therefore, a deflection device in a multiple particle beam system and, in particular, in a multi-beam particle microscope is arranged near the cathode and an associated beam stop is arranged in the vicinity of the anode, and hence still upstream of the generation of a multiplicity of individual particle beams. However, this standard arrangement can lead to unwanted charges in the vicinity of the multi-beam generator in multiple particle beam systems, the multi-beam generator being used to generate a multiplicity of individual particle beams from a single particle beam. These charges can be desirable and can prevent the sought-after illumination of the multi-beam generator that is as uniform as possible, or lead to lens effects of apertures in a multi-aperture plate of the multi-beam generator being impaired. In some cases, this can lead to image distortions.

SUMMARY

The present disclosure proposes an improved particle beam system, in particular a multi-beam particle microscope, including a deflection device and a beam stop.

Here, the disclosure takes into account the following considerations: Firstly, a multi-beam deflection device is used according to the disclosure for the purposes of collective deflection of a multiplicity of charged first individual particle beams. Thus, the multiplicity of individual particle beams are generated first and the optional blanking or deflecting using the multi-beam deflection device is only implemented subsequently and in collective fashion. Thus, as seen in the direction of propagation of the particle beams and in relation to the particle-optical beam path, the deflection device according to the disclosure is arranged downstream of a multi-beam generator, which first generates the multiplicity of individual particle beams. This can avoid unwanted charging of the multi-beam generator. Secondly, skillful arrangement of the beam stop in the particle-optical beam path can take account of the limited spatial conditions in a multiple particle beam system. This is because the beam stop is arranged level with a site at which a particle beam diameter is reduced or at a minimum. In this case, this might be the site of a crossover or an intermediate image, for example. The disclosure is explained in more detail below.

A first aspect of the disclosure relates to a particle beam system, such as a multi-beam particle microscope, including the following:

at least one particle source, which is configured to generate a beam of charged particles;

a first particle-optical unit with a first particle-optical beam path, the particle-optical unit being configured to generate a multiplicity of individual particle beams and image these on an object plane; and a second particle-optical unit, which is configured to image a multiplicity of second individual particle beams, which emanate from sites of incidence in the object plane, onto a detector unit;

wherein the particle beam system moreover includes the following:

a multi-beam generator, which is configured to generate a multiplicity of charged first individual particle beams from the beam of charged particles;

an objective lens, through which the individual particle beams substantially pass and which is configured to direct the first individual particle beams at the object plane such that the first individual particle beams impinge on the object plane at a multiplicity of sites of incidence;

a beam switch, arranged in the first particle-optical beam path between the multi-beam generator and the objective lens and arranged in the second particle-optical beam path between the objective lens and the detector unit, the first particle-optical beam path and the second particle-optical beam path branching within the beam switch, a beam stop; and a multi-beam deflection device with a controller, wherein the multi-beam deflection device is arranged in the first particle-optical beam path downstream of the multi-beam generator and upstream of the beam switch, wherein the controller is configured to collectively deflect the first individual particle beams temporarily using the multi-beam deflection device such that the first individual particle beams are substantially incident on the beam stop and consequently not the object plane, and wherein the beam stop is arranged in the first particle-optical beam path level with a site at which a particle beam diameter is reduced or is at a minimum.

The charged particles can be, e.g., electrons, positrons, muons or ions or other particles. The charged particles can be electrons generated, e.g., using a thermal field emission source (TFE). However, other particle sources can also be used.

In general, multi-beam generators are known. By way of example, a multi-beam generator can include a multi-lens array consisting of a multi-aperture plate and a counter electrode. Alternatively, the multi-beam generator could include a multi-aperture plate and a multi-deflector array. The two multi-beam generators differ in the way these generate the multiplicity of charged first individual particle beams; for example, a real intermediate image arises when a multi-lens array is used while a virtual intermediate image may arise when a multi-deflector array is used. The disclosure can be used in combination with the two described variants of a multi-beam generator, but other multi-beam generator configurations are also possible.

The particle-optical objective lens can be a magnetic lens or an electrostatic lens or a combined magnetic/electrostatic lens.

The multi-beam deflection device is arranged in the first particle-optical beam path downstream of the multi-beam generator and upstream of the beam switch in the propagation direction of the particle beams, thus between the multi-beam generator and the beam switch. This can prevent undesired charging of the multi-beam generator during a blanking procedure. Moreover, the multi-beam deflection device is configured to act on all first individual particle beams with the same deflection field. Thus, separate deflection devices are not provided for separate individual particle beams. Instead, the deflection of the individual particle beams is implemented collectively with the aid of the multi-beam deflection device.

The controller of the multi-beam deflection device is configured to deflect the first individual particle beams temporarily via the multi-beam deflection device such that the first individual particle beams are substantially incident on the beam stop and consequently not the object plane. The controller could be a separate controller for the multi-beam deflection device. The controller for the multi-beam deflection device could also be integrated in the controller of the overall system, i.e., in the controller of the particle beam system as a whole. The controller controls the blanking procedure. The deflection of the first individual particle beams obtained can be implemented here temporarily, rather than permanently. The temporal deflection could be implemented in interval-type fashion and the deflection time intervals each have the same length. However, these time intervals could also vary. Various modes of operation are described below.

Moreover, according to the disclosure, the beam stop is arranged in the first particle-optical beam path level with a site at which a particle beam diameter is reduced or at a minimum. This can take account of the limited spatial conditions in multiple particle beam systems. The specified reduced or minimum particle beam diameter can relate to the respective particle beam diameter of the plurality of individual particle beams. However, alternatively this could also relate to the overall particle beam diameter, which is formed by the multiplicity of individual particle beams overall, and hence by the particle beam array or bundle of individual particle beams. When referring to the site at which the particle beam diameter is reduced or at a minimum, reference is made to the particle-optical beam path in which there is no deflection by the multi-beam deflection device, but the individual particle beams are incident on the object plane. Consequently, the beam stop is also not situated at the site of reduced or minimum particle beam diameter in the case of a deactivated multi-beam deflection device; instead, it is situated level with this site, at the site impinged upon by the individual particle beams in the case of a deflection of the individual particle beams using the multi-beam deflection device.

According to an embodiment of the disclosure, the first particle-optical beam path has a cross-over plane of the individual particle beams upstream of the objective lens and the beam stop is arranged in the first particle-optical beam path level with the cross-over plane. The first individual particle beams cross one another in this cross-over plane, and so the particle beam diameter of the entire particle beam array is at a minimum or at least reduced here. The first individual particle beams can approach one another to the greatest possible extent in the cross over. Typically, the common cross section of all individual particle beams, i.e., of the bundle of individual particle beams, is approximately 25 μm to 200 μm in the cross-over plane. Thus, a beam stop can be arranged level with this crossover, even in the case of the restricted spatial conditions in a multi-beam particle beam system. Moreover, skilled arrangement and actuation of the multi-beam deflection device renders it possible to deflect the bundle of individual particle beams at the beam stop with likewise a very small particle beam diameter. Therefore, it is possible to also embody the beam stop itself as small as possible and in space-saving fashion. According to an embodiment of the disclosure, the cross-over plane is arranged between the beam switch and the objective lens.

According to an embodiment of the disclosure, the beam stop is arranged in the first particle-optical beam path substantially level with the upper focal plane of the objective lens facing the multi-beam generator. The diameter of the individual particle beams is at a minimum in this plane. The upper focal plane of the objective lens can correspond to the cross-over plane of the crossing individual particle beams. This setup also can allow a telecentric incidence of the individual particle beams on the object plane or the sample situated there.

According to an embodiment of the disclosure, the multi-beam deflection device is arranged and/or controlled in such a way that individual particle beams deflected by the multi-beam deflection device substantially experience a parallel offset in the cross-over plane and/or in the upper focal plane of the objective lens. Here, the multi-beam deflection device can be provided in the vicinity of an intermediate image. It is also possible to combine the multi-beam deflection device with a field lens system. The field lens system includes at least one field lens; it can also be a field lens system with two, three, four or more field lenses.

A parallel offset in the cross-over plane, according to which the site of incidence in the cross-over plane changes, but not the direction of the individual particle beams in the cross-open plane, can result in the fact that the particle beam diameter of the deflected or blanked individual particle beams is also reduced or minimal. Therefore, the beam stop arranged level with the cross over or in the cross-over plane can have correspondingly small dimensions or beam capture areas. A parallel offset in the upper focal plane of the objective lens can be desirable in that the sites of incidence of the individual particle beams in the object plane or on a sample do not change during the offset of the individual particle beams, to be precise until the deflected individual particle beams are deflected so far that they no longer pass through the objective lens, but are incident on the beam stop instead. The observable activation and deactivation of the individual particle beams can thus be implemented very quickly and suddenly here, without the individual particle beams passing over the object.

According to an embodiment of the disclosure, the beam stop includes a cup. Thus, the beam stop here is not a stop with a substantially planar surface or impingement face for the particle beams; instead, the beam stop has a predefined depth or cavity into which the deflected individual particle beams are deflected in order to be captured or absorbed there. The use of a beam stop with a certain depth can ensure a more efficient and, for example, a more targeted and defined beam capture than in the case of a beam stop with a plane surface such as a stop. Contaminations which charge further may form at the site of incidence of a deflected beam. By using a beam stop with a certain depression at the point of incidence, these charges can be shielded from other beams which pass the cup without a deflection. If the beam stop is correspondingly deep and narrow and if the direction of incidence of the particle beams to be absorbed therein is controlled accordingly, it is possible, even in the case of a reflection of individual particle beams, to prevent these reflected individual particle beams from re-emerging from the beam stop in uncontrolled and very divergent fashion. Accordingly, secondary electrons are also unable to emerge from the beam stop in uncontrolled and very divergent fashion. Moreover, charges in the entry region are largely avoided in the case of a targeted entry into the beam stop. Here, there can be different designs of the cup. By way of example, the cup can have a depth of more than 1 cm, for example of at least 1.5 cm.

According to an embodiment of the disclosure, the cup is substantially rotationally symmetric with respect to the optical axis of the particle beam system. This can allow for deflecting and absorbing of the individual particle beams in different directions.

According to an embodiment of the disclosure, the cup has a passage opening along its longitudinal axis and a trench with a substantially annular cross section for the beam capture is arranged around the passage opening. Here, the cup is arranged in such a way that the optical axis of the particle beam system extends through the passage opening of the cup, for example along the longitudinal axis of the cup. Thus, in this embodiment of the beam stop, the individual particle beams not deflected by the multi-beam deflection device pass through the passage opening of the cup substantially undisturbed. By contrast, if the multi-beam deflection device is activated, the individual particle beams are deflected into the annular trench. Here, the annular trench can have a continuous circumference such that the individual particle beams can be deflected in any direction about the optical axis of the system and steered into the trench. Skillful control of the multi-beam deflection device can thus allow the entire annular trench to be temporarily used for the beam capture, and so a charge distribution or charging arising as a result is distributed over the entire annular trench and not only localized at a few points of the trench.

According to an embodiment of the disclosure, a beam entry opening of the annular trench has a sharp edge on the inner annulus, wherein a surface that is inclined with respect to the longitudinal axis of the cup and points away from the longitudinal axis is provided extending into the trench from this sharp edge. The provision of the sharp edge can ensure that little area is present for charging the beam stop in the region of the beam entry opening. The conical surface, aligned as described and starting from this sharp edge, can contribute to the reflection of individual particle beams into the annular trench even in the case of a deflection over the cup edge. This can increase the efficiency of the beam stop.

According to a further embodiment of the disclosure, a diameter of the passage opening in the beam entry region increases starting from the beam entry opening of the passage opening. Here, the beam entry region denotes the upper region of the cup, facing the multi-beam deflection device in the installed state, and its passage opening. By way of example, the change in diameter of the passage opening can be achieved by way of an undercut. The diameter of the passage opening can be substantially constant in the direction of the particle-optical beam path below the beam entry opening. The described variation of the diameter in the upper region can ensure that individual particle beams passing through the cup do not come into contact with the inner tube or the inner wall of the passage opening and instead maintain a desired minimum distance from the inner wall of the passage opening.

According to an embodiment of the disclosure, an absorber material is arranged at the bottom of the annular trench. By way of example, this material is a material with a low backscatter coefficient for particle beams incident thereon. These can be materials with low atomic numbers such as, for example, carbon, aluminium, beryllium, etc. Additionally, the material can be chosen in such a way that no secondary electrons where possible are generated in the case of incidence on the material.

According to an embodiment of the disclosure, the cup is at least partly embedded in the objective lens, for example screwed in, and/or the cup is replaceable using a replacement tool. For this purpose, a thread for screwing the cup into the objective lens can be provided at the lower section of the cup, which lies opposite the beam entry opening. The particle-optical objective lens of a particle beam system normally includes an upper (source-side) pole shoe and a lower (object-side) pole shoe. Both pole shoes have a pole shoe bore that coincides with the optical axis of the objective lens. The beam tube with an evacuated interior can extend through the pole shoe bore of the upper pole shoe. Here, the upper pole shoe is normally not flat, but its form has a funnel-shaped embodiment and it can lie at ground potential. Now, the beam stop or cup can be wholly or partly embedded in the pole shoe bore of the upper pole shoe. This embedding in the beam tube can be implemented within the objective lens. The pole shoes of the objective lens are comparatively easily accessible. They can be reached through the sample chamber in order to attach or, where desired, replace the beam stop. Although the sample chamber is aerated during such a replacement, it is not necessary to break the high vacuum of the remainder of the particle beam system to this end. Consequently, embedding the cup in the objective lens can ensure that a possible replacement procedure for the cup is able to be carried out very quickly. The cup can be non-magnetic; this can be desirable if the objective lens is a magnetic objective lens.

According to an embodiment of the disclosure, the distance between the multi-beam deflection device and the multi-beam stop is at least 20 cm, such as at least 30 cm. This length specification relates to the minimum distance between the multi-beam deflection device and the beam stop since the components themselves also have a spatial extent. Measurements are taken along the optical axis of the system. The drift path of at least 20 cm, such as at least 30 cm, is comparatively long in this case. This can be desirable in that only comparatively low voltages are used for the deflection of the individual particle beams. The voltage is typically less than 100 V. If the drift path is shorter, i.e., the distance is less, then use has to be made of stronger electric fields for the deflection of the individual particle beams; if the drift path is only a few cm, the voltages used are in the region of 1 kV. However, work with low voltages is optional. The drift path between the multi-beam deflection device and the beam stop of at least 20 cm, such as at least 30 cm, is present, for example, if the beam stop is arranged in the first particle-optical beam path level with the cross-over plane between the beam switch and the objective lens.

According to an alternative embodiment of the disclosure, the beam stop is arranged in the first particle-optical beam path downstream of the multi-beam generator and upstream of the beam switch level with an intermediate image plane. In this case, the drift path can be significantly shorter in comparison with embodiments discussed above, but the desired absolute deflection can be less. In this arrangement of the beam stop, it is also the case that the beam stop is arranged in the first particle-optical beam path level with a site at which a particle beam diameter is reduced or at a minimum. By way of example, an intermediate image of the multi-beam source can arise in the region of a field lens system, wherein the foci of the individual particle beams passing the multi-beam generator can be considered to be corresponding sources of the multi-source. However, intermediate images can be generated between the multi-beam generator and the beam switch even without a field lens system.

According to an embodiment of the disclosure, the beam stop arranged in the first particle-optical beam path level with an intermediate image plane includes an aperture array. This array includes a multiplicity of openings through which the first individual particle beams can pass provided the multi-beam deflection device is not performing a beam deflection. By contrast, if the multi-beam deflection is activated or in operation, the sites of incidence of the individual particle beams on the aperture array in the intermediate image plane can be displaced, and the individual particle beams can consequently be incident on the array or the multi-stop. Here, the sites of incidence of the various individual particle beams can differ from one another. In this respect, too, this embodiment therefore differs from the above-described embodiment, according to which the beam stop is arranged level with the cross-over plane of the multiplicity of individual particle beams.

According to an embodiment of the disclosure, the multi-beam deflection device includes deflection plates. By way of example, these deflection plates can be arranged in pairs. The multi-beam deflection device can include a pair of deflection plates which deflect the individual particle beams collectively. It is also possible to provide a plurality of pairs of deflection plates in the multi-beam deflection device, which deflect the individual particle beams collectively. By way of example, two pairs of deflection plates which are arranged level in relation to the particle-optical beam path but rotated through 90° to one another could be provided. This can create variability in respect of the deflection direction or deflection directions generated by the multi-beam deflection device. The deflection plates can be electrostatic deflection plates which facilitate a fast deflection. However, it is also possible to use magnetic deflection devices.

According to a further embodiment of the disclosure, the multi-beam deflection device has a multi-stage embodiment. A plurality of pairs of deflection plates can also be provided in this case; however, these are arranged at different positions or at different levels in relation to the particle-optical beam path. In relation to the particle-optical beam path, the various stages of the multi-beam deflection device can be arranged in succession, for example. Here, it is possible that other components of the particle-optical unit are also located between the various stages of the multi-beam deflection device. However, it is also possible for the stages of the multi-deflection device to directly follow one another. The provision of a second stage or a further stage for the multi-beam deflection device can be desirable in that the deflection by the multi-beam deflection device can be set very accurately. Moreover, a second stage offers an additional degree of freedom which, for example, can be used to also set the incidence of the individual particle beams in the object plane differently once again.

According to an embodiment of the disclosure, the multi-beam deflection device is configured in such a way that the bundle of individual particle beams is deflectable in different deflection directions. By way of example, this can already be achieved using one pair of deflection plates providing the direction of the electric field between the two plates is reversible. Further pairs of deflection plates or else other configurations for a multi-beam deflection device also enable the deflection of the bundle of the individual particle beams in different deflection directions. This can be desirable in that charges on the beam stop do not only occur cumulatively at certain positions, but can be distributed better, provided the occurrence thereof cannot be avoided in any case.

According to a second aspect of the disclosure, the latter relates to a method for operating a particle beam system and, for example, a particle beam system as described above in numerous embodiment variants. According to the disclosure, the method includes the following steps:

scanning an object via the first individual particle beams in a first line; and
scanning an object via the first individual particle beams in a second line;
deflecting the individual particle beams via the multi-beam deflection device during a line jump from the first line to the second line in accordance with a first setting of the multi-beam deflection device.

Here, a first setting of the multi-beam deflection device can characterize the deflection direction and deflection power obtained thereby. By way of example, a first setting of the multi-beam deflection device corresponds to an electric field applied to the multi-beam deflection, which causes the effect described.

According to the disclosure, the individual particle beams are therefore deflected or blanked during the transition from a first line to a second line. Thus, this relates to blanking during a line jump. During such a line jump, the individual particle beams would be incident in uncontrolled fashion on the object or pass over the latter in the absence of a blanking procedure. This would lead to charges on the object, which could reduce the resolution of the particle beam system. It is therefore generally desirable to suppress the incidence of the individual particle beams on an object during the line jump.

According to a further embodiment of the disclosure, the method furthermore includes the following steps:

scanning an object via the individual particle beams in a third line;
deflecting the individual particle beams via the multi-beam deflection device during a line jump from the second line to the third line in accordance with a second setting of the multi-beam deflection device.

Here, this second setting of the multi-beam deflection device differs from the first setting of the multi-beam deflection device. By way of example, the strength of the electric field applied to the multi-beam deflection device can be altered. It is also possible that it is not the strength, but only the direction of the electric field that is altered, hence altering the deflection direction. A combination of a change in the field strength and a change in the direction of the field is also possible. It is also possible that different activated parts, for example plates or plate pairs, of the multi-beam deflection device characterize the different settings. A variation of the settings of the multi-beam deflection device can ensure that inevitably occurring residual charges on the beam stop do not accumulate at certain sites.

According to an embodiment of the disclosure, different settings of the multi-beam deflection device are selected at random. This random selection can be based on a random method or else pseudo-random method. What is achieved in both cases is that the sites of incidence of the individual particle beams on the beam stop are varied when the multi-beam deflection device is activated and no accumulations of unwanted charges arise and/or the unwanted charges are distributed symmetrically on the beam stop.

According to a third aspect of the disclosure, the latter relates to a method for operating a particle beam system, for example a particle beam system as described above in a plurality of embodiment variants. The method includes the following steps:

scanning a first region of an object via the first individual particle beams;
scanning a second region of an object via the first individual particle beams; and
deflecting the individual particle beams via the multi-beam deflection device during a change of region from the first region to the second region, at least in accordance with a first setting of the multi-beam deflection device.

Thus, this embodiment variant does not relate to blanking during a line jump of the scanning individual particle beams; instead, this can relate to an image change: The images generated with the aid of the particle beam system are normally composed of various individual images. Here, a single individual particle beam passes over the so-called single field of view (sFOV) and the multiplicity of individual particle beams, i.e., the bundle of the individual particle beams, accordingly pass over a multi field of view (mFOV). Then, an overall image is composed of various multi fields of view or multi-images. A small pause typically arises during an image change or a change of region between two multi fields of view during which the object should not be scanned or probed with the individual particle beams. For this reason, blanking of the individual particle beams is often undertaken during this change of region. The pause involved during a change of region is usually longer than a pause during a line jump of the individual particle beams during the generation of their respective individual images. Therefore, the strategies for driving the multi-beam deflection device during a change of region may also differ from those during a change of line. The risk of charging during longer blanking times can be correspondingly greater, and so, in general, care should be taken to vary the sites of incidence of the individual particle beams on the beam stop particularly well during a change of region. According to an embodiment of the disclosure, different settings of the multi-beam deflection device are used in alternating fashion during the change of region. By way of example, it may be possible to alternate between 2, 3, 4, 5 or more settings, for example as per 1-2-1-2-1-2 or else 1-2-3-4-5-1-2-3-4-5-1-2-3-4-5 . . . .

According to a further embodiment of the disclosure, different settings of the multi-beam deflection device are randomly selected and used. Here, use can once again be made of a random method or pseudo-random method in order to switch between the various settings of the multi-beam deflection device. Here, it is possible for the multi-beam deflection device to always remain activated during the change of region and for the individual particle beams never to pass the multi-beam deflection device without deflection and never be incident on the object.

According to an embodiment of the method according to the disclosure, a rotationally symmetric cup is used as a beam stop, which has a passage opening along its longitudinal axis, wherein a trench with a circular cross section for the beam capture is arranged around the passage opening; and wherein the circular trench for the beam capture is traversed by the settings of the multi-beam deflection device.

Thus, according to this embodiment variant of the disclosure, the individual particle beams are captured or absorbed along the entire trench of the cup. This can ensure a uniform and also rotationally symmetric charge distribution in the cup. To the extent charges arise, these are approximately rotationally symmetric and have a significantly smaller disturbing effect on the particle beam passing through the passage opening of the cup along the optical axis. Moreover, when the cup is arranged in the cross-over plane of the individual particle beams, these individual particle beams are close together or overlay one another, and so the effect of charge distributions on the individual particle beams is the same, in general, for each individual particle beam.

According to a fourth aspect of the disclosure, the latter relates to a computer program product with a program code for carrying out the method, as has been described above in more detail in accordance with the second and third aspect of the disclosure in a plurality of embodiment variants. The program code can be subdivided into one or more partial codes. Any conventional programming language can be used as programming language.

The above described embodiment variants of the disclosure can be combined wholly or partly with one another, provided that no technical contradictions arise as a result. The same also applies for a combination of features according to the first, the second, the third and the fourth aspect of the disclosure with one another.

BRIEF DESCRIPTION OF THE DRAWINGS

The disclosure may be understood even better with reference to the accompanying figures. In the figures.

DETAILED DESCRIPTION

Figure 1:
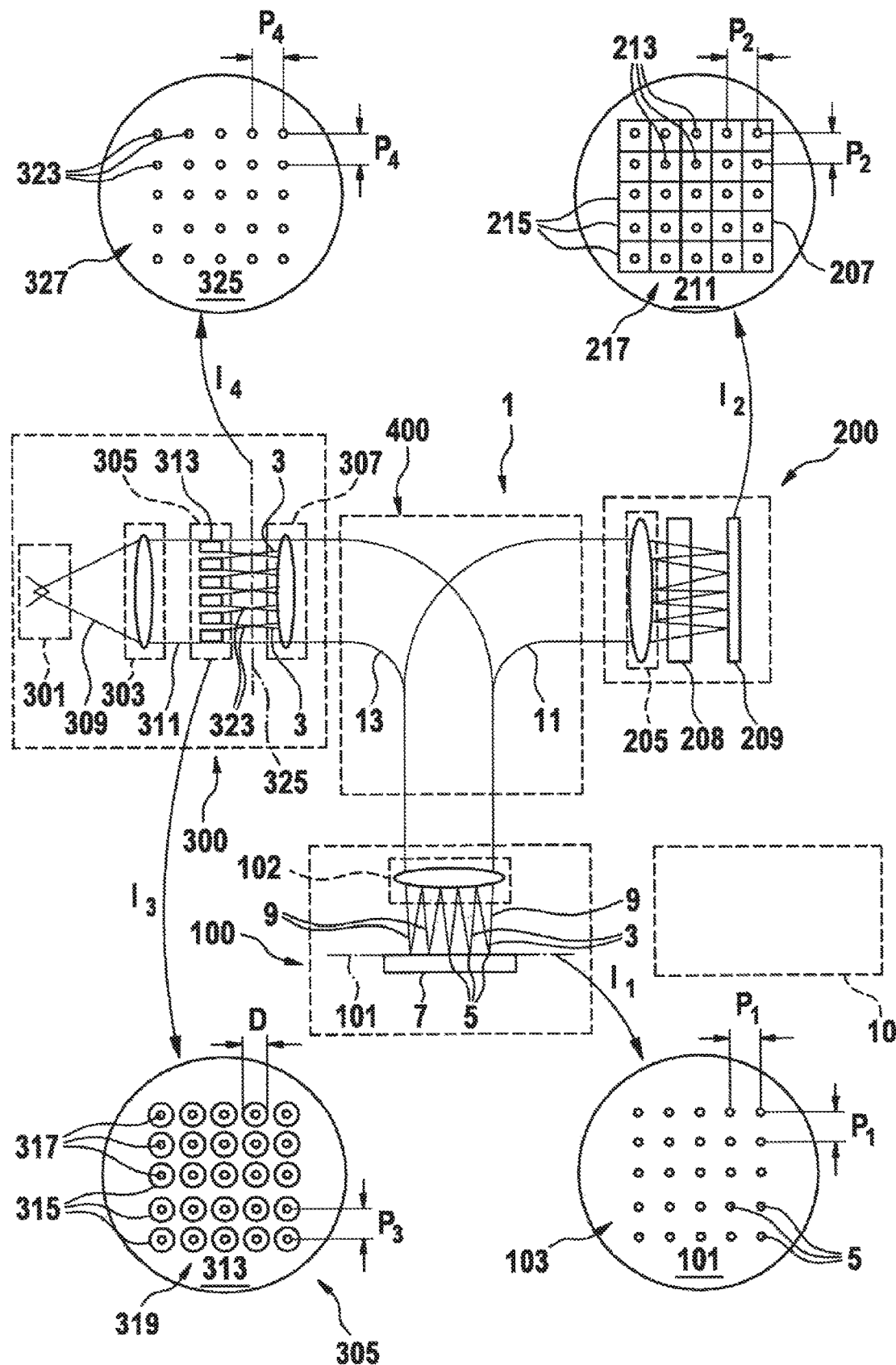
FIG. 1 shows a schematic illustration of a particle beam system in the form of a multi-beam particle microscope.

FIG. 1 is a schematic illustration of a particle beam system 1 in the form of a multi-beam particle microscope 1, which uses a multiplicity of particle beams. The particle beam system 1 generates a multiplicity of particle beams which impinge on an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of sites 5 and generate there a plurality of electron beam spots, or spots, that are spatially separated from one another. The object 7 to be examined can be of any desired type, e.g. a semiconductor wafer or a biological sample, and can include an arrangement of miniaturized elements or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular field 103 of sites of incidence 5 formed in the first plane 101. In FIG. 1, the number of sites of incidence is 25, which form a 5×5 field 103. The number 25 of sites of incidence is a number chosen for reasons of simplified illustration. In practice, the number of beams, and hence the number of sites of incidence, can be chosen to be significantly greater, such as, for example, 20×30, 100×100 and the like.

In the embodiment illustrated, the field 103 of sites of incidence 5 is a substantially regular rectangular field having a constant pitch $P_1$ between adjacent sites of incidence. Exemplary values of the pitch $P_1$ are 1 micrometre, 10 micrometres and 40 micrometres. However, it is also possible for the field 103 to have other symmetries, such as a hexagonal symmetry, for example.

A diameter of the beam spots shaped in the first plane 101 can be small. Exemplary values of the diameter are 1 nanometre, 5 nanometres, 10 nanometres, 100 nanometres and 200 nanometres. The focusing of the particle beams 3 for shaping the beam spots 5 is carried out by the objective lens system 100.

The primary particles striking the object generate interaction products, e.g. secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 includes a particle-optical unit having a projection lens 205 for directing the secondary particle beams 9 onto a particle multi-detector 209.

The excerpt $I_2$ in FIG. 1 shows a plan view of the plane 211, in which individual detection regions of the particle multi-detector 209 on which the secondary particle beams 9 are incident at the sites 213 are located. The sites of incidence 213 lie in a field 217 with a regular pitch $P_2$ with respect to one another. Exemplary values of the pitch $P_2$ are 10 micrometres, 100 micrometres and 200 micrometres.

The primary particle beams 3 are generated in a beam generating apparatus 300 including at least one particle source 301 (e.g. an electron source), at least one collimation lens 303, a multi-aperture arrangement 305 and a field lens 307. The particle source 301 generates a diverging particle beam 309, which is collimated or at least substantially collimated by the collimation lens 303 in order to shape a beam 311 which illuminates the multi-aperture arrangement 305.

The excerpt 13 in FIG. 1 shows a plan view of the multi-aperture arrangement 305. The multi-aperture arrangement 305 includes a multi-aperture plate 313 which has a plurality of openings or apertures 315 formed therein. Midpoints 317 of the openings 315 are arranged in a field 319 that is imaged onto the field 103 formed by the beam spots 5 in the object plane 101. A pitch $P_3$ between the midpoints 317 of the apertures 315 can have exemplary values of 5 micrometres, 100 micrometres and 200 micrometres. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which impinge on the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometres, 100 nanometres and 1 micrometre.

The field lens 307 and the objective lens 102 provide a first imaging particle-optical unit for imaging the plane 325, in which the beam foci 323 are formed, onto the first plane 101 such that a field 103 of sites of incidence 5 or beam spots arises there. Should a surface of the object 7 be arranged in the first plane, the beam spots are correspondingly formed on the object surface.

The objective lens 102 and the projection lens arrangement 205 provide a second imaging particle-optical unit for imaging the first plane 101 onto the detection plane 211. The objective lens 102 is thus a lens which is part of both the first and the second particle-optical unit, while the field lens 307 belongs only to the first particle-optical unit and the projection lens 205 belongs only to the second particle-optical unit.

A beam switch 400 is arranged in the beam path of the first particle-optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881 A2, WO 2007/028595 A2, WO 2007/028596 A1, WO 2011/124352 A1 and WO 2007/060017 A2 and the German patent applications DE 10 2013 016 113 A1 and DE 10 2013 014 976 A1, the disclosure of which in the full scope thereof is incorporated by reference in the present application.

The multi-beam particle beam system furthermore has a computer system 10 configured both for controlling the individual particle optical components of the multi-beam particle beam system and for evaluating and analysing the signals obtained by the multi detector 209. In this case, the computer system 10 can be constructed from a plurality of individual computers or components.

Figure 2:
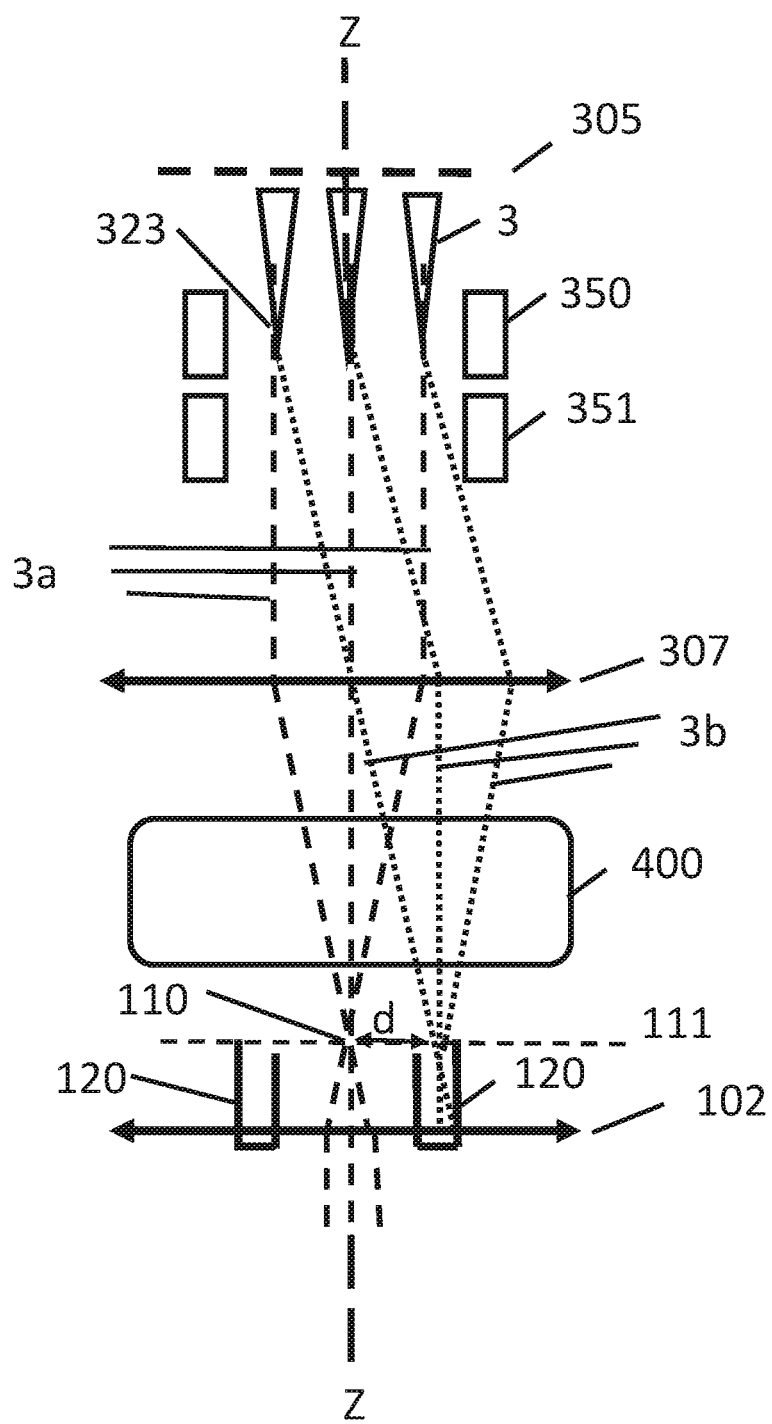
FIG. 2 schematically shows a particle beam system including a multi-beam deflection device and including a beam stop in the region of the cross-over plane of the individual particle beams.

FIG. 2 schematically shows a particle beam system 1 including a multi-beam deflection device 350 and including a beam stop 120 arranged in the region of the cross-over plane 111 of the individual particle beams 3, 3a. The beam path is presented in a much simplified fashion. Charged particles emanating from a particle source (not illustrated) are incident on a multi-aperture arrangement or a multi-beam generator 305, which is configured to generate a multiplicity of charged first individual partial beams 3 from the beam of charged particles. In the illustrated example embodiment, the multi-beam generator 105 has a focusing effect on the individual particle beams 3. By way of example, this can be achieved with the aid of a multi-lens array in combination with a multi-aperture plate, but other embodiment options for the multi-beam generator (e.g., a multi-deflector array in combination with a multi-aperture plate) are also possible. In this sense, the illustrated example embodiment should not be construed as restrictive.

As a result of the focusing effect of the multi-beam generator 305 in the shown example, beam foci 323 arise in a focal plane downstream of the multi-beam generator 305 in relation to the particle-optical beam path. In the shown example, a multi-beam deflection device 350 is arranged level with this focal plane or level with the beam foci 323. In the example shown, this multi-beam deflection device 350 consists of two mutually parallel deflection plates (one pair). An electric field can be applied between these deflection plates. The multi-beam deflection device 350 is arranged downstream of the multi-beam generator 305 and upstream of a field lens system 307 in the first particle-optical beam path. This arrangement prevents the multi-beam generator 305 from inadvertently being electrostatically charged, for example in non-uniform fashion, by incident particle beams during a beam deflection by the multi-beam deflection device 350.

Now, two different first particle-optical beam paths of the individual particle beams 3 are plotted in the illustration as per FIG. 2: individual particle beams 3a which pass through the particle beam system 1 without experiencing a deflection by the multi-beam deflection device 350 are plotted in dashed lines and labelled by the reference sign 3a. By contrast, if the multi-beam deflection device 350 is switched on or activated, the individual particle beams 3b follow a different particle-optical beam path, which is schematically indicated in FIG. 2 by the dotted lines.

If the unperturbed particle-optical beam path of the non-deflected individual particle beams 3a is now considered first, the individual particle beams 3a pass through a beam switch 400 after passing through the field lens system 307 and then pass through a particle-optical objective lens 102, which images the individual particle beams 3a on an object (not illustrated). The individual particle beams 3a cross one another between the field lens system 307 and the objective lens 102 or between the beam switch 400 and the objective lens 102 and form the so-called cross over 110. This cross over 110 is located in the cross-over plane 111. In the region of the cross over 110 or within the cross-over plane 111, the particle beam diameter of the entire beam array of individual particle beams 3a is reduced or, in the optimal case, at a minimum. If the site of the crossing individual particle beams 110 is now displaced within the cross-over plane 111, a beam stop can be arranged at this site of the displacement with space-saving measures. Such a beam stop 120 is shown in FIG. 2. If the multi-beam deflection device 350 is activated or if an electric field is applied between the parallel plates, the individual particle beams 3b experience a deflection to the side. After passing the field lens system 307 or the beam switch 400, the individual particle beams 3b cross within the cross-over plane 111 at a position offset by the distance d; here, d denotes a parallel offset of the cross over 110 in the cross-over plane 111. The upper edge of the beam stop 120 is located approximately level with the cross-over plane 111. Thus, the deflected individual particle beams 3b enter into the beam stop 120 with a particle beam diameter of the bundle of individual particle beams that is as small as possible or minimal. As a result of the small overall particle beam diameter, it is also possible to embody the beam stop 120 in cup-shaped fashion. Here, cup-shaped means that the beam stop 120 has a certain depth and that the incident individual particle beams 3b do not only strike a plane plate. The depth of the cup can be greater than the diameter of the cup 120. The deeper and narrower the cup 120 can be embodied (the greater the aspect ratio) and the deeper the individual particle beams 3b deflected by the multi-beam deflection device 350 can penetrate into the cup, the better is the effect of the beam stop 120. In the example shown, the cup 120 moreover has a rotationally symmetric embodiment with respect to the optical axis Z of the particle beam system 1. This can be desirable in that the deflection of individual particle beams 3b can be implemented in different directions. However, it is also possible to embody a cup 120 to not be rotationally symmetric with respect to the optical axis Z, for example, to instead provide the cup on one side of the optical axis Z only.

FIG. 2 moreover shows an optionally provided second stage of a multi-beam deflection device 351, which is arranged in the particle-optical beam path between the multi-beam deflection device 350 and the field lens system 307 or the beam switch 400. With the aid of this second optional stage, it is possible to set the beam path of the deflected individual particle beams 3b even more accurately when carrying out blanking. Thus, it is possible, for example, to accurately set an angle of incidence of the individual particle beams 3b on the beam stop 120 in the cross-over plane 111. In addition or as an alternative thereto, a parallel offset of the individual particle beams 3b can be set in the upper focal plane of the objective lens 102 which—as already explained in detail above—allows very fast and precise blanking, for example during a line jump or a change of region.

Figure 3:
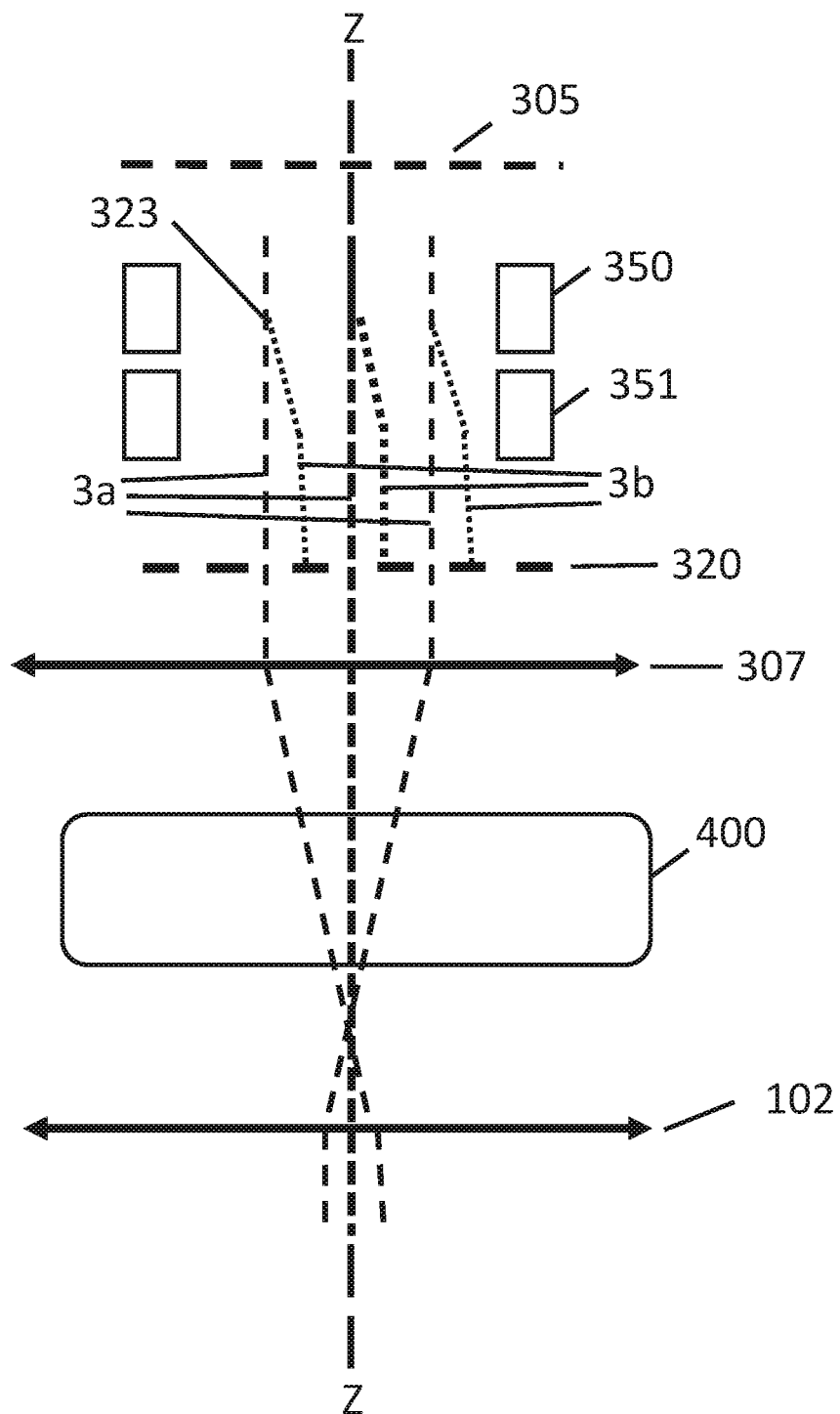
FIG. 3 schematically shows a particle beam system including a multi-beam deflection device and including a beam stop in the region of an intermediate image.

FIG. 3 schematically shows a particle beam system 1 including a multi-beam deflection device 350 and including a beam stop 320 according to a second embodiment of the disclosure. In general, the same reference signs in FIGS. 2 and 3 denote the same features of the respectively illustrated particle beam system 1. To avoid unnecessary repetition, the explanations below predominantly focus on the relevant differences between the embodiment variant illustrated in FIG. 3 and the embodiment variant already described in FIG. 2. The beam path is likewise presented in a much simplified fashion.

In the particle beam system 1 illustrated in FIG. 3, the beam stop 320 is situated at a different position, to be precise between the multi-beam deflection device 350 and the field lens system 307 or the beam switch 400. In the example shown, the beam stop 320 is situated in an intermediate image plane, i.e., in a plane in which the individual particle beams are focussed. In relation to the first particle-optical beam path, the beam stop 320 in this solution is therefore situated further up, i.e., further to the source side, in the particle-optical beam path than in the embodiment in FIG. 2. However, it also applies to the region of the intermediate image that the particle beam diameter is reduced or, in a best case scenario, minimal there. However, this relates to the respective particle beam diameter of the individual particle beams 3 in this case. A beam stop 320 can likewise be arranged in comparatively space-saving fashion in the region of the intermediate image.

In the exemplary embodiment illustrated in FIG. 3, the beam stop 320 includes an aperture array. This is illustrated schematically by the dashed line of the beam stop 320 at the intermediate image. When the multi-beam deflection device 350 is deactivated, the individual particle beams 3a pass the beam stop 320 in unimpeded fashion. However, when the multi-beam deflection device 350 is activated, the particle beams 3b are offset within the intermediate image plane and strike the plate of the aperture array 320. As a result, the individual particle beams 3b are blanked and no longer reach the object (not illustrated).

Moreover, the individual particle beams 3a are separated quite clearly from one another in the region of the intermediate image, and so the individual particle beams can also be easily displaced separately from one another in a lateral direction within the intermediate image plane via the multi-beam deflection device 350. Very precise work is desired in this case in order to even facilitate precise blanking of the individual particle beams 3. Here, it is possible for a central beam of each individual particle beam 3a, 3b to pass orthogonally through the apertures of the beam stop 320 or to orthogonally strike the plate of the aperture array 320 when the multi-beam deflection device 350 is activated.

A drift path between the site of the multi-beam deflection device 350 and the beam stop 320 is reduced here in comparison with the embodiment illustrated in FIG. 2; nevertheless, work only needs to be carried out with relatively low voltages on the multi-beam deflection device 350 since a small offset of the individual particle beams 3 within the intermediate image plane is already sufficient for masking or blanking of the individual particle beams 3. By way of example, in the case of a drift path of approximately 5 cm, the offset here is approximately 50 µm, which corresponds to a deflection of individual particle beams 3b through approximately 1 mrad. In the embodiment variant illustrated in FIG. 2, the offset of the cross over 110 in the cross-over plane 111 is approximately 1.5 mm in the case of a drift path of approximately 30 cm, corresponding to a deflection of the individual particle beams 3b through approximately 5 mrad.

Figure 4:
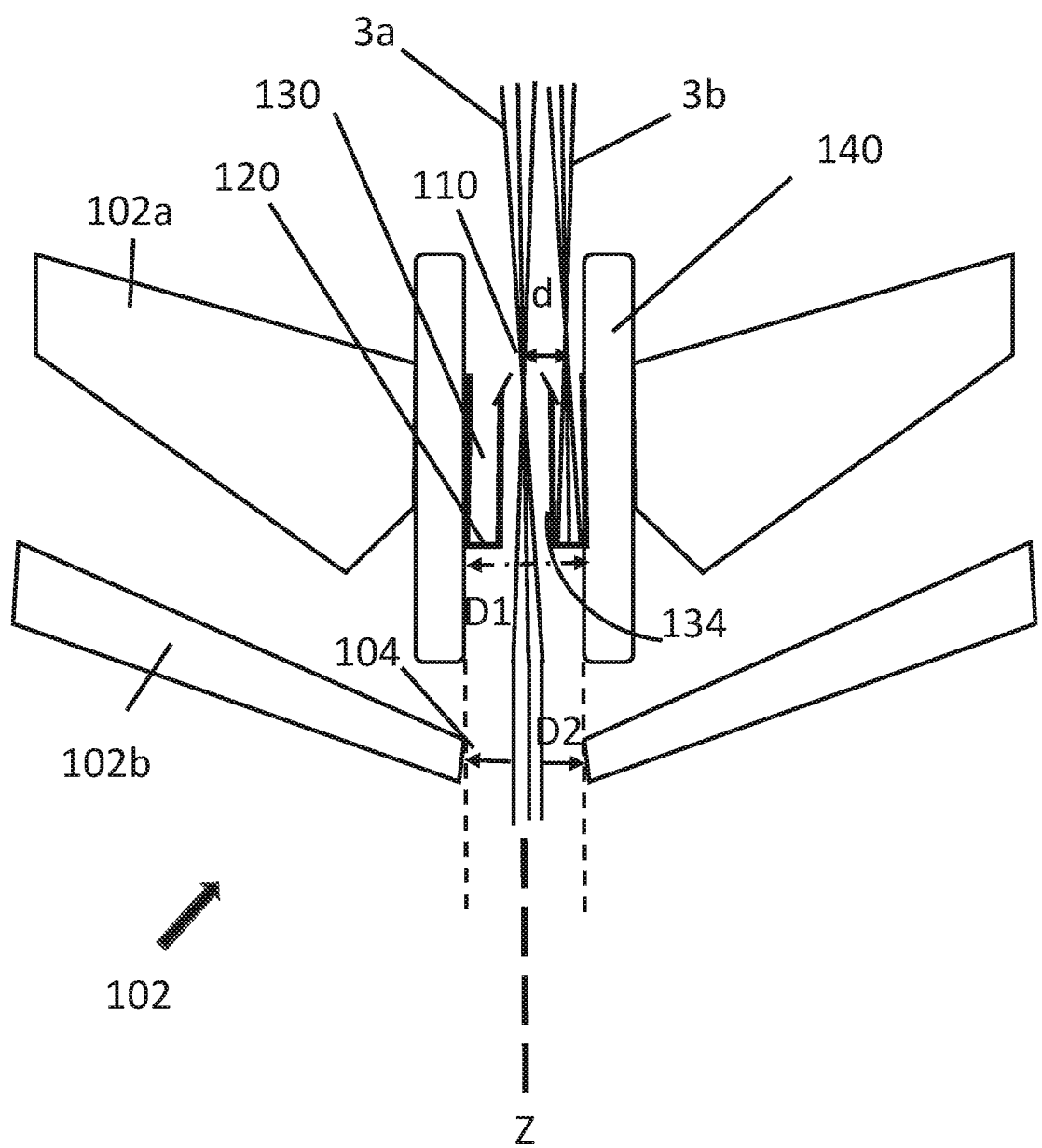
FIG. 4 schematically shows the arrangement of a beam stop in cup form within the objective lens.

FIG. 4 schematically shows the arrangement of a beam stop 120 in cup form within an objective lens 102. The particle-optical objective lens 102 includes an upper pole shoe 102a and a lower shoe 102b. A magnetic field is created between the pole shoes 102a and 102b, the magnetic field having a focusing effect (not illustrated) on individual particle beams 3a passing through the objective lens 102. A beam tube 140 protrudes into the upper pole shoe 102a of the objective lens 102. In the upward direction, for example, this beam tube 140 can merge into a beam switch (not illustrated). A vacuum or a high vacuum is prevalent within the beam tube 140. In the example shown in FIG. 4, the beam tube 140 has a rotationally symmetric embodiment about the optical axis Z of the system. Now, the beam stop 120 is situated in the region of the upper pole shoe 102a and within the beam tube 140 in the region of the cross over of the individual particle beams 3 with the beam stop 120 having a cup in the illustrated exemplary embodiment.

The cup-shaped beam stop 120 includes a passage opening 134 and a trench 130. In the non-deflected state, the individual particle beams 3a pass through the beam stop 120 through the passage opening 134. However, should the multi-beam deflection device 350 (not illustrated in FIG. 4) be activated, the individual particle beams experience a deflection, which is represented by the reference sign 3b of the individual particle beams in FIG. 4. The individual particle beams 3b strike the trench 130 of the beam stop 120, which trench has an annular cross section. The trench 130 is comparatively deep in comparison with the width of the trench 130.

Moreover, FIG. 4 illustrates that it is possible to mount the cup-shaped beam stop 120 in the upper pole shoe 102a of the objective lens 102, for example screw it therein, through the lower pole shoe 102b of the objective lens 102. The external diameter D1 of the cup 120 is less than or equal to the aperture diameter D2 of the lower pole shoe 102b of the objective lens 102. This can implement a quick replacement of the beam stop 120 within the objective lens 102. Replacement is possible within approximately one hour. To this end, the sample chamber is aerated below the objective lens 102 (the sample chamber is not illustrated); it is not necessary to break the high vacuum in the upper region of the beam tube 140.

Figure 5:
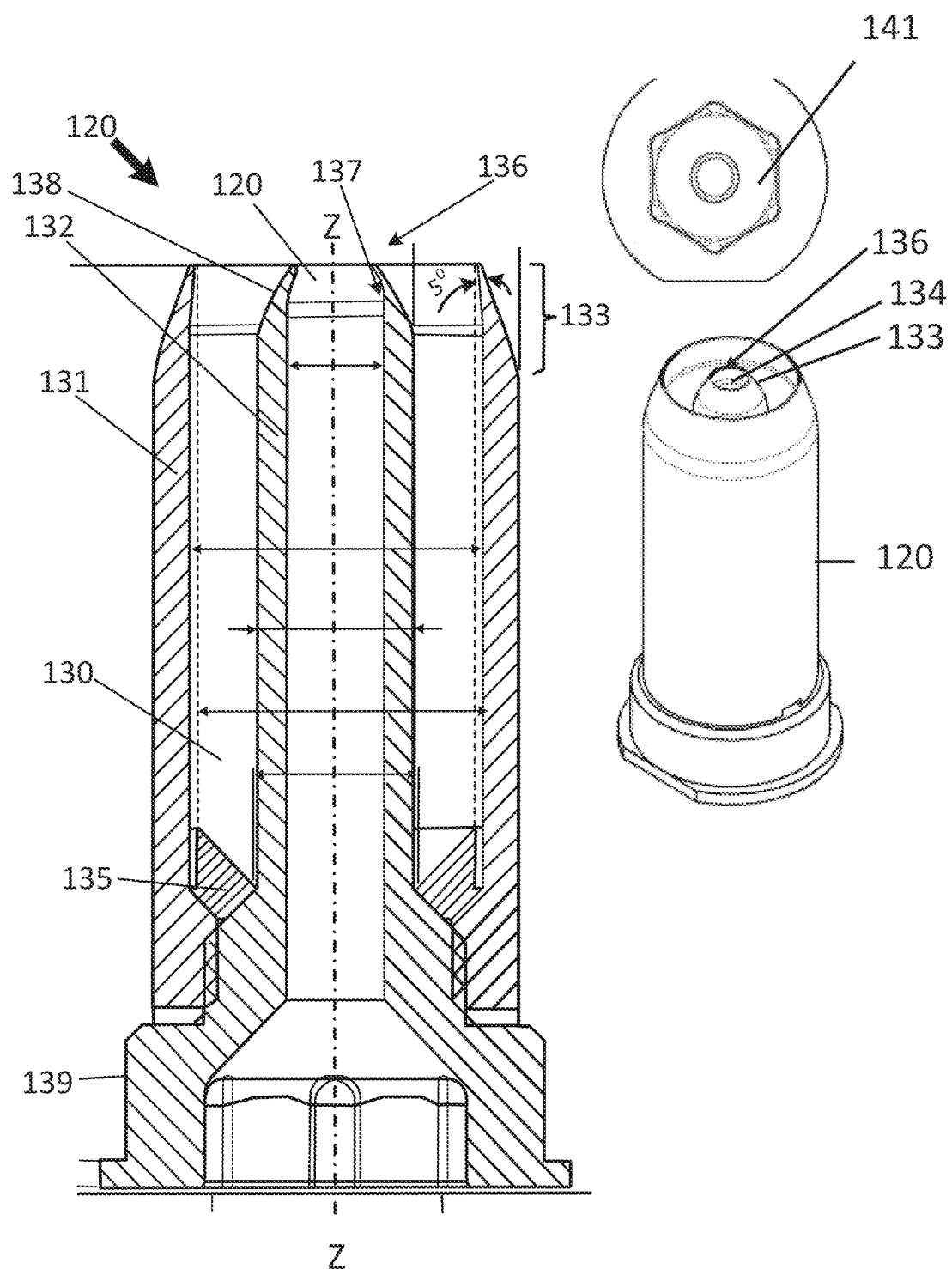
FIG. 5 schematically shows the structure of a beam stop in cup form in a cross section and a 3D view.

FIG. 5 schematically shows the structure of a beam stop 120 in cup form in a cross section and a 3D view. Its geometric design has various features facilitating efficient beam capture. Overall, the cup-shaped beam stop 120 has a substantially rotationally symmetric embodiment. This applies, for example, to the upper region of the cup 120, the so-called beam insert region 133.

In the example shown, the beam stop 120 includes a passage opening 134 and a trench 130 with an annular cross section. Now, a sharp edge 136 is provided right at the top, at the passage opening 134, in the beam entry region 133. This sharp edge 136, or edge tapering to a point, can ensure that only a few charge carriers have space at that point and that, consequently, only a little charging of this edge 136 by way of individual particle beams 3b striking the latter is even possible. Moreover, a conical surface 138 that is inclined with respect to the longitudinal axis of the cup and points away from the longitudinal axis is provided extending into the trench 130 from this sharp edge 136. This angular or conical surface 138 serves to reflect incident individual particle beams over the edge of the cup 120 and into the trench 130, e.g., even during blanking. Moreover, the diameter of the passage opening 134, as seen in the beam direction, widens in the beam entry region 133 starting from the beam entry opening of the passage opening 134. Thus, an undercut 137 is provided in the beam entry region 133 in the region of the passage opening 134 so that individual particle beams 3a entering the passage opening 134 do not come into contact with the inner tube 132 of the cup 120; instead, the distance between the individual particle beams 3a and the inner tube 132 of the cup remains sufficiently large.

An absorber material 135 is optionally provided in a lower region of the trench 130. Here, this can be a material with a low backscattering coefficient for particle radiation, for example a material with a low atomic number such as, for example, carbon, aluminium or beryllium, etc.

Moreover, a thread 139 for screwing the cup 120 into an objective lens 102, for example into the upper pole shoe 102a of the objective lens 102, is provided at the lower region of the cup 120. For example, a hex key 141 can be used for screwing purposes.

Overall, the beam stop 120 has a substantially rotationally symmetric configuration. Especially the beam entry region 133, which forms the upper region of the cup or of the beam stop 120, is rotationally symmetric. This facilitates an optimal or uniform charge distribution. Moreover, this can offer one or more desirable features in view of the Larmor rotation. The beam bundle will rotate about the optical axis as a result of a change in the setting of the magnetic lenses in the system, e.g., when changing the work point of the system (landing energy, beam current, etc.). For the blanking procedure, this means that the direction in which the beam bundle is deflected in the cross-over plane depends on the lens settings in the system. In general, this rotation could be compensated by a corresponding change in the settings of the multi-beam deflection device. However, such a compensation is not necessary in the case of a rotationally symmetric configuration of the beam stop and the multi-beam deflection device and the control therefor can have a simpler configuration.

Figure 6:
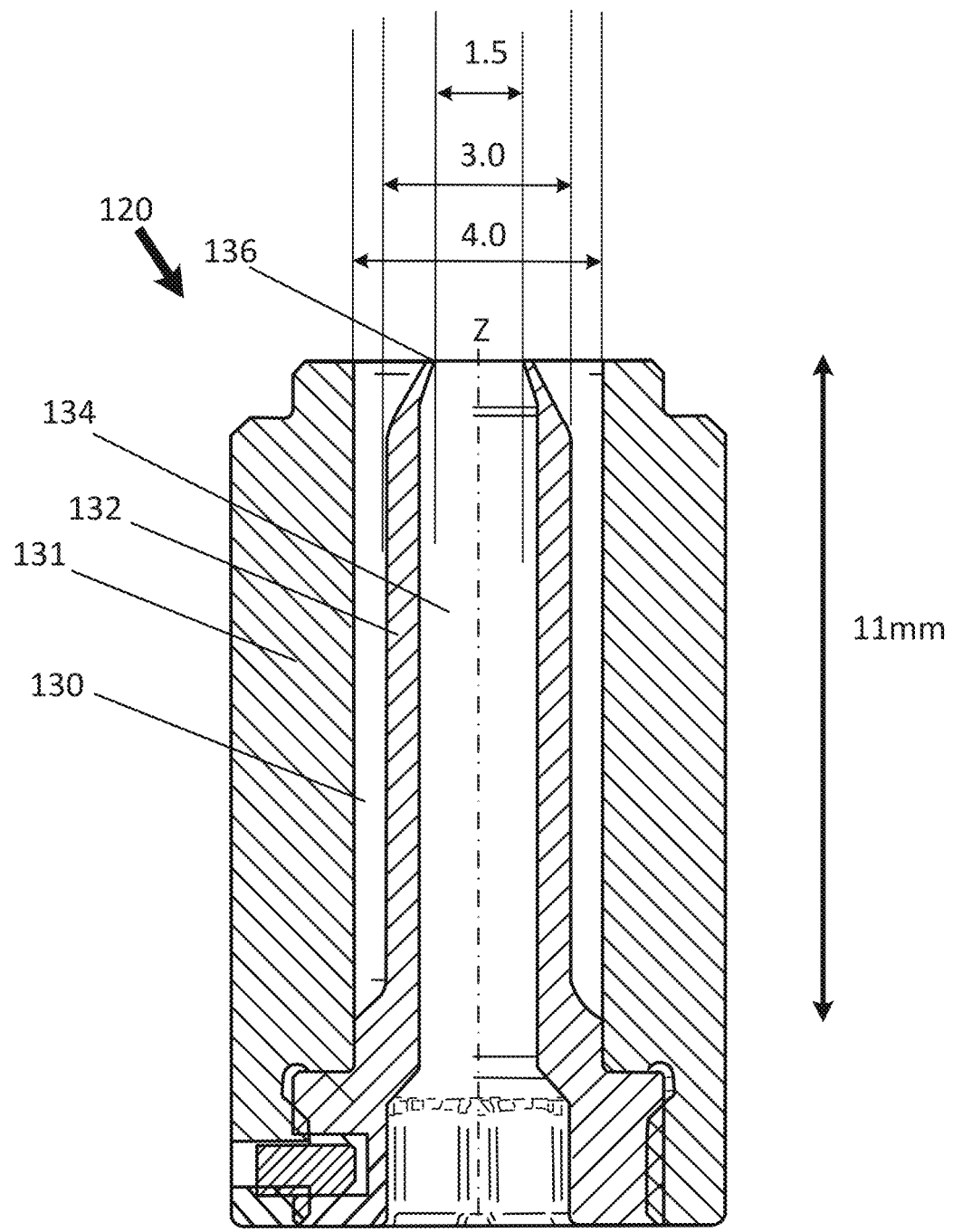
FIG. 6 schematically shows the structure of a further beam stop in cup form in a cross section.

FIG. 6 schematically shows the structure of a further beam stop 120 in cup form in a cross section. This cup 120, too, has a substantially rotationally symmetric arrangement with respect to the optical axis Z of the particle beam system 1. In comparison with the embodiment variant illustrated in FIG. 5, the cup 120 in FIG. 6 has a different configuration of the outer wall 131. It does not taper to a point in the upper region, but has steps and is slightly curved. This makes it easier to mount/introduce the cup 120 in the pole shoe of an objective lens. Moreover, some dimensions of the cup 120 in FIG. 6 and FIG. 5 differ from one another. Some dimensions are specified in exemplary fashion in FIG. 6; however, these should not be construed as restrictive to the disclosure. Accordingly, the depth of the trench 130 is 11 mm. The diameter of the passage opening 134 is 1.5 mm at the narrowest site at the upper edge 136 in this case. The width of the annular trench 130 is 0.5 mm.

Figure 7A:
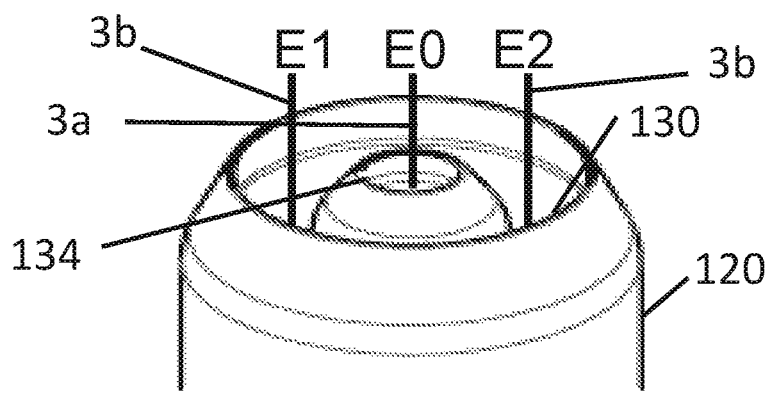
FIGS. 7A-7C illustrate the effect of three different settings of the multi-beam deflection device when particle beams are incident on a beam stop.
Figure 7B:
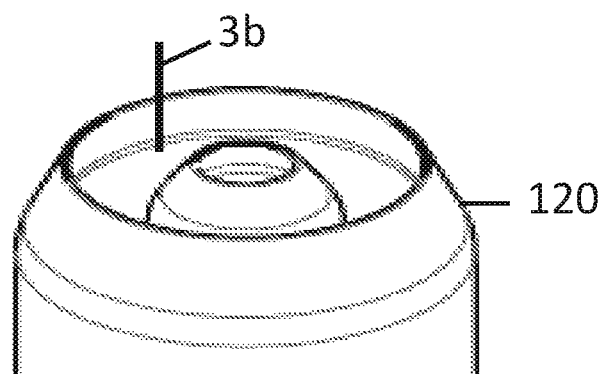
Figure 7C:
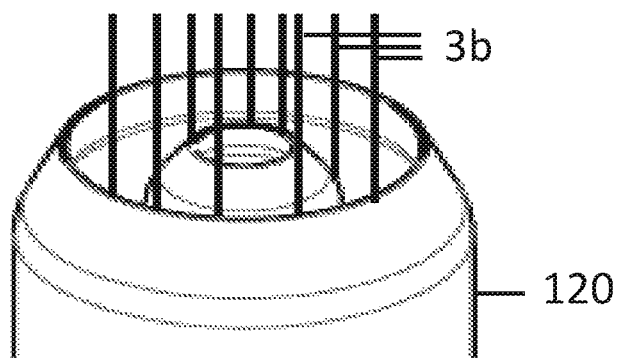

FIGS. 7A-7C illustrate the effect of three different settings of the multi-beam deflection devices 350 when particle beams 3b are incident on a beam stop 120. FIG. 7A illustrates two settings E1 and E2, in which the multi-beam deflection device 350 is activated and the beams 3b are deflected into the trench 130 of the beam stop 120. By contrast, there is no deflection of an individual particle beam in a setting E0 of the multi-beam deflection device 350; rather, the multiplicity of the individual particle beams 3a pass through the passage opening 134 of the beam stop 120 in substantially unimpeded fashion. In relation to the zero setting E0, there is in accordance with FIG. 7A a deflection of the individual particle beams 3b to the left in the case of the setting E1 and to the right in the case of the setting E2. Such an actuation in accordance with the settings E0, E1 and E2 is expedient, for example in conjunction with a line jump of individual particle beams 3. By way of example, it is possible to operate a particle beam system 1 as described above as follows: An object is scanned line-by-line using the first individual particle beams 3a. There is a line jump between the scanning in the individual lines and the individual particle beams 3b are blanked with the aid of the multi-beam deflection device 350 during this line jump from one line to a further line such that the particle beams 3b impinge upon a beam stop 120, 320. There is a corresponding deflection during each line jump. Now, according to FIG. 7A, there is alternation between the two settings E1 and E2 from line jump to line jump. Thus, there is blanking to the left (E1) at one point and blanking to the right (E2) in the next instance. This leads to symmetric charging of the edge of the beam stop 120 that is grazed when starting and stopping the blanking of the particle beams. As a consequence, charges on both sides compensate. Naturally, it is also possible to provide further settings E3 and E4, etc., in addition to the settings E1 and E2 and to alternate between these settings during the blanking in order to distribute charges even better. An astigmatism generated by charges can also be removed by a deflection in more than two directions, i.e., for example, using the settings E1, E2, E3 and E4, which, for example, each correspond to deflection directions arranged at a 90° spacing from one another.

Moreover, it is also possible to deliberately avoid blanking directions found to be poor, e.g., as a result of local contaminations.

FIGS. 7B and 7C show blanking strategies that can be used in the case of relatively long blanking, e.g., between various image recordings and consequently when changing regions of recordings: According to an embodiment, the rotationally symmetric trench 130 of the beam stop 120 is traversed in dynamic fashion. Thus, the deflected individual particle beams 3b move along a circular trajectory about the optical axis of the beam stop 120 or about the optical axis Z of the overall system. To this end, the multi-beam deflection device can include a plurality of electrode pairs arranged around the optical axis, which are impinged with sine or cosine-type deflection potentials that vary over time. According to FIG. 7c), a new, arbitrary position is approached during each blanking procedure. The latter can be determined in truly random or pseudo-statistical fashion. Thus, it is the case that settings of the multi-beam deflection device 350 are ascertained and set in random or pseudo-random fashion. There is averaging as a result of this random process and possible contaminations or accumulations of charge are also distributed better in this case.

Moreover, it is also possible to switch back and forth between positions precisely defined in advance, e.g., the positions E1 and E2 as per FIG. 7A.

Figure 8:
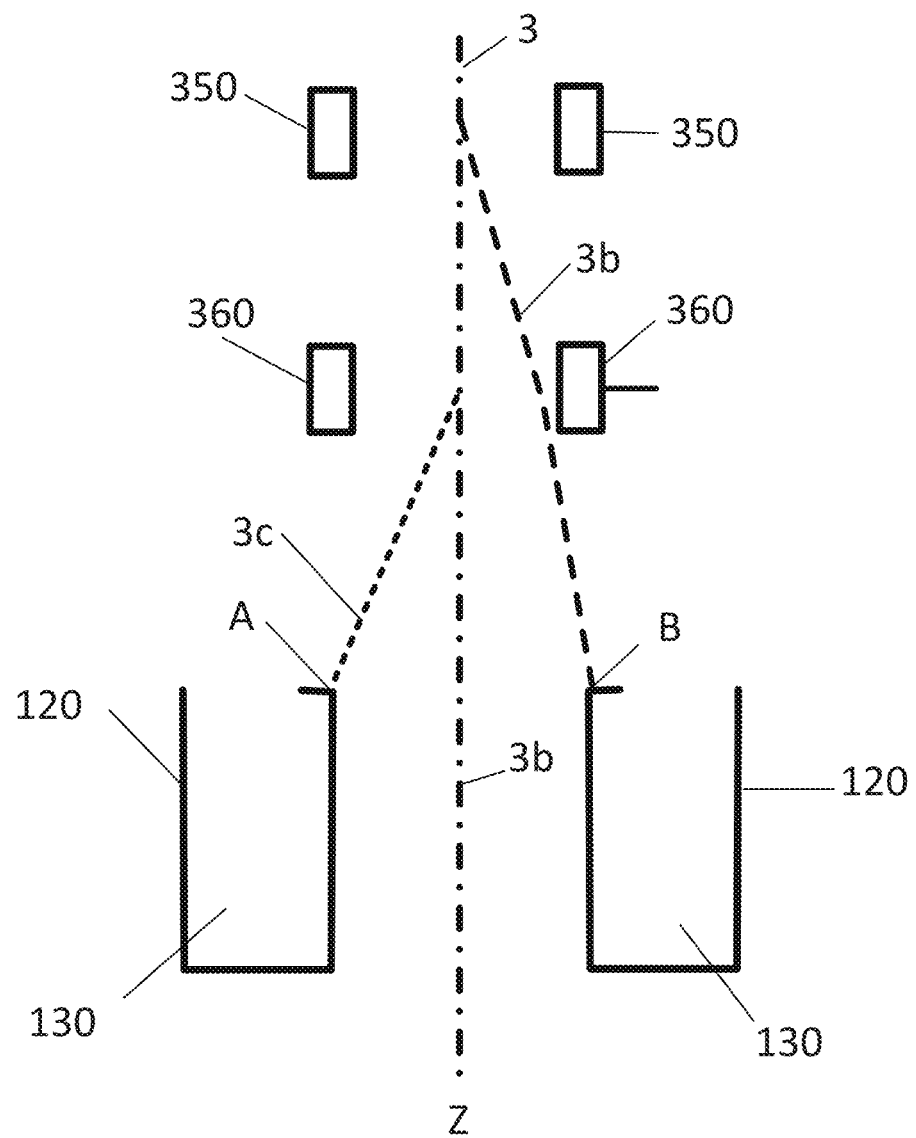
FIG. 8 illustrates a possible adjustment for a multi-beam deflection device, in combination with a cup-shaped beam stop.

FIG. 8 illustrates a possible adjustment for a multi-beam deflection device 350, which is provided in combination with a cup-shaped beam stop 120. It is important that the beam stop 120 is hit correctly. To this end, a deflection sensitivity of the beam blankers 350 or of the multi-beam deflection device 350 in the plane of the beam stop (e.g., within the cross-over plane 111) is known. However, for reasons of space, it is not possible to carry out detections there to check whether the beam stop 120 is hit correctly. An additional difficulty can arise if the multi-beam deflection device 350 can only deflect individual particle beams 3 in one direction.

One approach to a solution offers the use of a further deflector 360. This further deflector 360 is located in the particle-optical beam path between the multi-beam deflection device 350 and the beam stop 120. If both the multi-beam deflection devices 360 and the deflector 360 are deactivated, the multi-particle beam or the multiplicity of the individual particle beams 3 extend along the optical axis Z of the system. Now, the multi-beam is deflected to the edge of the beam stop 120 with the deflector 360 (position A) such that the central beam 3c of the multi-beam array is just cropped at the beam stop 120 (dotted line). Then, the particle beam is deflected to the opposite edge of the beam stop 120 with the multi-beam deflection device 350 (position B) such that the central beam 3b of the multi-beam array is, once again, just cropped at the beam stop 120 (dashed line). The multi-beam deflector voltage involved to this end is recorded and the sensitivity can be calculated by way of the known dimensions of the beam stop 120 (more accurately: the diameter of the inner opening of the beam stop 120) or the multi-beam deflector voltage to deflect the multiplicity of the individual particle beams from the initial state into the trench 130 of the beam stop 120 can be calculated directly. Alternative adjustments are possible.

LIST OF REFERENCE SIGNS

1 Particle beam system
3 Primary particle beams
3a Particle beams not deflected by the multi-beam deflection device
3b Particle beams deflected by the multi-beam deflection device
5 Site
7 Object
9 Secondary particle beams
10 Computer system
25 Site of incidence
100 Objective lens system
101 Object plane
102 Objective lens
102a Upper pole shoe of the objective lens
102b Lower pole shoe of the objective lens
103 Field of sites of incidence in the object plane
104 Opening in the lower pole shoe
110 Cross over
111 Cross-over plane
120 Beam stop in the cross-over plane, cup
130 Trench
131 Outer wall of the trench/cup
132 Inner wall of the trench
133 Beam entry region, upper region of the cup
134 Passage opening
135 Absorber material, material with a low backscatter coefficient
136 Sharp edge
137 Undercut
138 Inclined surface
139 Thread
140 Beam tube
141 Hex key
200 Detector system
205 Projection lens
209 Particle multi-detector
211 Detection plane
213 Sites of incidence for detection
217 Field of sites of incidence for detection
301 Particle source
303 Collimation lens
305 Multi-aperture arrangement
307 Field lens, field lens system
309 Diverging particle beam
311 Particle beam
313 Multi-aperture plate
315 Aperture
319 Field of the apertures
320 Beam stop at the intermediate image
323 Beam foci
325 Focal plane
350 Multi-beam deflection device
350 2nd stage (optional) of the multi-beam deflection device
360 Deflector
400 Beam switch
A Position, edge of the cup
B Position, edge of the cup
E0 Beam in the case of setting 0 of the multi-beam deflection device
E1 Beam in the case of setting 1 of the multi-beam deflection device
E2 Beam in the case of setting 2 of the multi-beam deflection device
d Parallel offset of the cross over in the cross-over plane
D1 External diameter of the cup
D2 Opening diameter of lower pole shoe of the objective lens P₁ Pitch between sites of incidence (object)
P₂ Pitch between sites of incidence (detection)
P₃ Pitch between the centres of the apertures

What is claimed is:

1. A particle beam system, comprising:
    a particle source configured to generate a beam of charged particles;
    a first particle-optical unit having a first particle-optical beam path, the first particle-optical unit comprising:
        a multi-beam generator configured to generate a multiplicity of first individual charged particle beams from the beam of charged particles generated by the particle source, the first individual charged particle beams following the first particle-optical beam path;
        an objective lens configured to direct the multiplicity of first individual charged particle beams to an object plane so that the first individual charged particle beams follow the first particle-optical path and impinge on the object plane at a multiplicity of sites of incidence;
        a beam switch in the first particle-optical beam path between the multi-beam generator and the objective lens;
        a beam stop in the first particle-optical beam path; and
        a multi-beam deflection device in the first particle-optical beam path downstream of the multi-beam generator and upstream of the beam switch;
    a detector unit;
    a second particle-optical unit to image a multiplicity of second individual charged particle beams, which emanate from sites of incidence in the object plane, onto the detector unit along a second particle-optical beam path,
    wherein:
        the beam switch is in the second particle-optical beam path between the objective lens and the detector unit;
        the particle beam system is configured so that the first particle-optical beam path and the second particle-optical beam path branch within the beam switch;
        the multi-beam deflection device comprises a controller configured to collectively deflect the first individual charged particle beams temporarily via the multi-beam deflection device so that the first individual charged particle beams are substantially incident on the beam stop and not on the object plane;
        the beam stop is arranged in the first particle-optical beam path level with a site at which a particle beam diameter is reduced or is at a minimum;
        the beam stop comprises a cup; and
        the cup is at least partly embedded in the objective lens, and/or the cup is replaceable.

2. The particle beam system of claim 1, wherein the first particle-optical beam path has a cross-over plane of the first individual charged particle beams upstream of the objective lens, and the beam stop is arranged in the first particle-optical beam path level with the cross-over plane.

3. The particle beam system of claim 1, wherein the beam stop is arranged in the first particle-optical beam path level with an upper focal plane of the objective lens facing the multi-beam generator.

4. The particle beam system of claim 1, wherein at least one of the following holds:
    the first particle-optical beam path has a cross-over plane of the first individual charged particle beams, and the multi-beam deflection device is controllable so that the deflected first individual charged particle beams substantially experience a parallel offset in the cross-over plane; and
    the objective lens has an upper focal plane, and the multi-beam deflection device is controllable so that the deflected first individual charged particle beams substantially experience a parallel offset in the upper focal plane.

5. The particle beam system of claim 1, wherein the cup is substantially rotationally symmetric with respect to the optical axis of the particle beam system.

6. The particle beam system of claim 1, wherein:
    the cup comprises a passage opening along its longitudinal axis;
    the cup comprises a trench with an annular cross section around the passage opening; and
    the cup is configured so that the optical axis of the particle beam system extends through the passage opening of the cup.

7. The particle beam system of claim 6, wherein a beam entry opening of the trench has a sharp edge on its inner annulus, a surface extends into the trench from the sharp edge, and the surface is inclined with respect to the longitudinal axis of the cup and points away from the longitudinal axis.

8. The particle beam system of claim 7, wherein a diameter of the passage opening in the beam entry region increases starting from the beam entry opening of the passage opening.

9. The particle beam system of claim 6, further comprising an absorber material at the bottom of the annular trench.

10. The particle beam system of claim 1, wherein a distance between the multi-beam deflection device and the beam stop is at least 20 cm.

11. The particle beam system of claim 1, wherein the multi-beam deflection device comprises deflection plates.

12. The particle beam system of claim 1, wherein the multi-beam deflection device comprises a multi-stage device.

13. The particle beam system of claim 1, wherein the multi-beam deflection device is configured to deflect the first individual charged particle beams in different deflection directions.

14. A method, comprising:
    providing the particle beam system of claim 1;
    scanning an object via the first individual charged particle beams in a first line; and
    scanning the object via the first individual particle beams in a second line;
    deflecting the first individual charged particle beams via the multi-beam deflection device during a line jump from the first line to the second line in accordance with a first setting of the multi-beam deflection device.

15. One or more machine-readable hardware storage devices comprising instructions that are executable by one or more processing devices to perform operations comprising the method of claim 14.

16. A system, comprising:
    one or more processing devices; and
    one or more machine-readable hardware storage devices comprising instructions that are executable by the one or more processing devices to perform operations comprising the method of claim 14.

17. The method of claim 14, further comprising:
    scanning the object via the first individual particle beams along a third line; and
    deflecting the individual particle beams via the multi-beam deflection device during a line jump from the second line to the third line according to a second setting of the multi-beam deflection device, wherein the second setting is different from the first setting.

18. The method of claim 14, further comprising randomly selecting different settings of the multi-beam deflection device.

19. A method, comprising:
providing the particle beam system of claim 1;
scanning a first region of an object via the first individual particle beams;
scanning a second region of the object via the first individual particle beams; and
deflecting the individual particle beams via the multi-beam deflection device during a change of region from the first region to the second region at least according to a first setting of the multi-beam deflection device.

20. The method of claim 19, further comprising alternately using different settings of the multi-beam deflection device during the change of region.

* * * * *